| United States Patent [19] | [11] Patent Number: 4,924,286 |
| Ishibashi | [45] Date of Patent: May 8, 1990 |

[54] SEMICONDUCTOR DEVICE

[75] Inventor: Kiyoshi Ishibashi, Itami, Japan

[73] Assignee: Mitsubishi Denki Kabushiki Kaisha, Tokyo, Japan

[21] Appl. No.: 224,404

[22] Filed: Jul. 26, 1988

[30] Foreign Application Priority Data

Feb. 3, 1988 [JP] Japan .................................. 63-24281

[51] Int. Cl.$^5$ ........................................... H01L 27/02
[52] U.S. Cl. ....................................... 357/46; 357/53
[58] Field of Search ........................ 357/34, 52, 53, 46

Primary Examiner—Andrew J. James
Assistant Examiner—Mark Prenty
Attorney, Agent, or Firm—Oblon, Spivak, McClelland, Maier & Neustadt

[57] ABSTRACT

A Darlington power transistor comprising two transistors ($Q_1$, $Q_2$) has a clip diode ($D_i$) for clipping high surge voltage. A field plate (9a) is formed in a surface of a channel cut region (8) existing in peripheral portion of the semiconductor chip, and is further extended by prescribed size ($L_B$) toward a transistor forming region.

5 Claims, 3 Drawing Sheets

SEMICONDUCTOR DEVICE

BACKGROUND OF THE INVENTION

1. Field of the Invention

The present invention relates to a semiconductor device and more particularly, it relates to a transistor of high breakdown voltage type having a built-in clip diode, which is employed as a switching element in an ignition device for an automobile, for example.

2. Description of the Prior Art

In a power transistor employed as a switching element in a transistor type ignition device for an automobile, high surge voltage, which is induced from the secondary side to the primary side of an ignition coil, is applied upon fire-cutoff of the ignition device. Therefore, a transistor employed for such use requires some means for protecting the same against breakage caused by the high surge voltage.

For example, a power transistor of the aforementioned transistor type ignition device has been generally protected by a method of: (1) deliberately decreasing a coupling coefficient in the ignition coil, or (2) designing the structure of the power transistor to ensure a breakdown voltage (hereinafter referred to ES/B proof value) for withstanding surge voltage excited upon fire-cutoff of the ignition device.

FIG. 1 is a sectional view showing the structure of a conventional npn Darlington power transistor (hereinafter simply referred to as a power transistor) employed in an ignition device for an automobile, and FIG. 2 is a ciruit diagram showing an equivalent circuit of the power transistor shown in FIG. 1. Referring to FIG. 1, an n$^+$-type diffusion layer 2 is formed on a first main surface 101 of an n$^-$-type substrate layer 1 of silicon to form a collector, which is common to two transistors $Q_1$ and $Q_2$ shown in FIG. 2. This collector 2 is connected to a collector terminal C through an aluminum wire layer 3. A p-type diffusion layer 4 is formed in a part of the second main surface 102 of the n$^-$-type substrate layer 1, to form bases of the two transistors $Q_1$ and $Q_2$. This p-type diffusion layer 4 is provided therein with an n$^+$-type diffusion layer 5a forming an emitter of the transistor $Q_1$ and an n$^+$-type diffusion layer 5b forming an emitter of the transistor $Q_2$. The emitter 5a of the transistor $Q_1$ is connected to the base 4 of the transistor $Q_2$ through an aluminum wire layer 6a which is formed over surfaces of the n$^+$-type diffusion layer 5a and a central part of the p-type diffusion layer 4. The emitter 5b of the transistor $Q_2$ is connected to an emitter terminal E through an aluminum wire layer 6b which is formed over surfaces of the n$^+$-type diffusion layer 5b and the p-type diffusion layer 4. Further, the base 4 of the transistor $Q_1$ is connected to a base terminal B through an aluminum wire layer 6c which is formed on the a surface of p-type diffusion layer 4. Referring to FIG. 2, resistors $R_1$ and $R_2$ interposed between the respective bases and emitters of the transistors $Q_1$ and $Q_2$ indicate resistance values caused in the p-type diffusion layer 4 of FIG. 1. A p-n junction diode $D_0$ interposed between the collector and the emitter of the transistor $Q_2$ as shown in FIG. 2 is provided by the n$^+$n$^-$p structure shown in FIG. 1. A guard ring 7 for mitigating field strength of an inversion layer (not shown) in the n$^-$-type substrate layer 1 is formed of a p-type diffusion region provided around a power-transistor-forming region including transistors $Q_1$ and $Q_2$, and a channel cut region 8, being formed of an n$^+$-type diffusion region, is provided in the form of a ring around the guard ring 7. The channel cut region 8 functions to prevent the inversion layer of the n$^-$-type substrate layer 1 from extending in the lateral direction. A field plate 9, being maintained at a prescribed potential with respect to the emitter terminal E, is provided on a surface of the channel cut region 8, in order to strengthen the function of the channel cut region 8. A silicon oxide film 10 is formed over the second main surface 102 being not covered with the aluminum wire layers 6a, 6b and 6c, and field plate 9.

The power transistor has such n$^+$pn$^-$n$^+$ structure that, even if high voltage is applied to a reverse-biased collector-base junction part, a depletion layer widely spreads in the n$^-$-type substrate layer 1 to mitigate field strength thereof. As a result, breakdown voltage $V_{CBO}$ of the collector-base junction part is maintained at a high value. Further, when the depletion layer spreading in the n$^-$-type substrate layer 1 reaches the guard ring 7, an electric potential is induced/excited in the guard ring 7 so that the depletion layer further spreads from the p-n junction part of the guard ring 7 to the n$^-$-type substrate layer 1, whereby the breakdown voltage $V_{CBO}$ is further increased by the guard ring 7.

In structural design of this power transistor, the range of high surge voltage applied between the collector and the emitter of the power transistor is experimentally obtained to optimally design specific resistance, thickness etc. of the n$^-$-type substrate layer 1 according to the range of high surge voltage, thereby to ensure a high ES/B proof value. An experiment for obtaining the range of the high surge voltage is performed by intendedly bringing the secondary side of an ignition coil into a fire-cutoff state to induce/excite high surge voltage in the primary side.

However, dispersion of ES/B proof value caused on the manufacturing process cannot be avoided when a high ES/B proof value is ensured by optimally controlling numerical values concerning physical properties of silicon semiconductor, as is the case with the power transistor structure hereinabove described. Thus, a screening has been generally required to perform an ES/B proof test on each power transistor as manufactured to eliminate those of less than the target ES/B proof value. Further, the aforementioned countermeasure is not sufficient to prevent the power transistor from breaking down, since the power transistor may be exposed to, under actual circumstances being placed on an automobile as an ignition device, such high surge voltage that cannot be anticipated by indoor simulation.

There has been proposed, in place, a power transistor having a clip diode inserted between a collector and a base for clipping high surge voltage which is higher than prescribed voltage (hereinafter referred to as clip voltage). A power transistor having a clip diode added from the exterior and a power transistor having a built-in clip diode for attaining convenience in handling have been put into practice.

FIG. 3 is a sectional view showing structure of a conventional power transistor having a built-in clip diode in which a p-n junction diode is integrally interposed between a collector and a base as the clip diode. FIG. 4 is a circuit diagram showing an equivalent circuit of the power transistor as shown in FIG. 3. The power transistor of FIG. 3 is different from that shown in FIG. 1 in that a p$^+$-type diffusion region 11 is formed in a part of an n$^-$-type substrate layer 1 which is immediately under an aluminum wire layer 6c so that a p-n junction diode $D_i$ shown in FIG. 4, whose cathode and anode are connected to a collector C and a base B respectively, is integrally interposed between the collector C and the base B.

In this power transistor, reverse breakdown voltage $V_R$ of the p-n junction diode $D_i$ is utilized as clip voltage for clipping surge voltage. The reverse breakdown voltage $V_R$ is set at desired clip voltage so that high surge voltage applied between the collector C and the emitter E is clipped at the clip voltage. In case where the reverse breakdown voltage $V_R$ of the p-n junction diode $D_i$ is set at 400 V under the room temperature, for example, the p-n junction diode $D_i$ breaks down when high surge voltage exceeding 400 V is applied between the collector C and the emitter E of the power transistor. Therefore, base current flows through a path of C→B→E as shown by an arrow a in FIG. 4, whereby the power transistor enters an ON state. Thus, the voltage $V_{CBO}$ between the collector C and the base B of the power transistor is clipped at the reverse breakdown voltage $V_R$ of the p-n junction diode $D_i$, i.e., at 400 V, as shown by a curve b in FIG. 5.

In the power transistor having a built-in clip diode, the reverse breakdown voltage $V_R$ of the p-n junction diode $D_i$ has a strong temperature coefficient (about 1.25 V/°C. according to the inventor's measurement), whereby the reverse breakdown voltage $V_R$, i.e., clip voltage is shifted to a higher voltage side as the device temperature is increased, as shown by a curve c in FIG. 5. Assuming that a transistor type ignition device carried on an automobile is exposed to temperatures within a range of $-30°$ C. to $+125°$ C., for example, the range of variation in the clip voltage, being calculated through the temperature difference of 155° C., reaches about 200 V. Thus, the structure of a power transistor must be designed in consideration of the variation range of the clip voltage, while it is difficult to design a power transistor working in such a wide variation range of 200 V.

For solving such a problem, the p-n junction diode $D_i$ may be formed as a punch-through type one to reduce temperature dependency of its reverse breakdown voltage $V_R$, as well known in the art. However, when such a punch-through type p-n junction diode is built in a power transistor such as a Darlington transistor, the $p^+$-type diffusion region 11 of the p-n junction diode $D_i$, for example, must be formed deeper by at least 1.5 times to twice than the p-type diffusion layer 4 of the base, in order to maintain the property of the transistor at a prescribed level. Therefore, productivity is reduced because the time for diffusing impurities is increased to about 2.3 to 4 times as compared with the ordinary case. Further, there are other problems in view of controllability for other characteristics of the power transistor and of production quality control, and hence it is difficult to build in a punch-through type p-n junction diode as a clip diode.

SUMMARY OF THE INVENTION

A semiconductor device according to the present invention comprises: (a) a semiconductor chip having: (a-1) a collector layer of a first conductivity type, (a-2) a base layer of a second conductivity type formed in a part of a first surface of the collector layer, (a-3) an emitter layer of the first conductivity type formed in a part of a surface of the base layer, and (a-4) a semiconductor layer of the second conductivity type formed in another part of the first surface, the semiconductor layer contacting the base layer and having higher conductivity than the base layer, a junction of the semiconductor layer and the collector layer being a pn diode junction; (b) a collector electrode layer formed on a second surface of the collector layer, (c) an emitter electrode layer formed on a surface of the emitter layer, (d) a base electrode layer formed on a surface of the semiconductor layer, (e) an insulation layer formed on a part of the first surface surrounding the base layer, and (f) a field plate electrode layer formed on a part of a surface of the insulation layer, a part of the insulation film being sandwitched between the field plate electrode layer and the collector layer.

Accordingly, an object of the present invention is to provide a semiconductor device having a built-in clip diode, which can be easily introduced into a manufacturing process and which can reduce temperature dependency of clip voltage.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
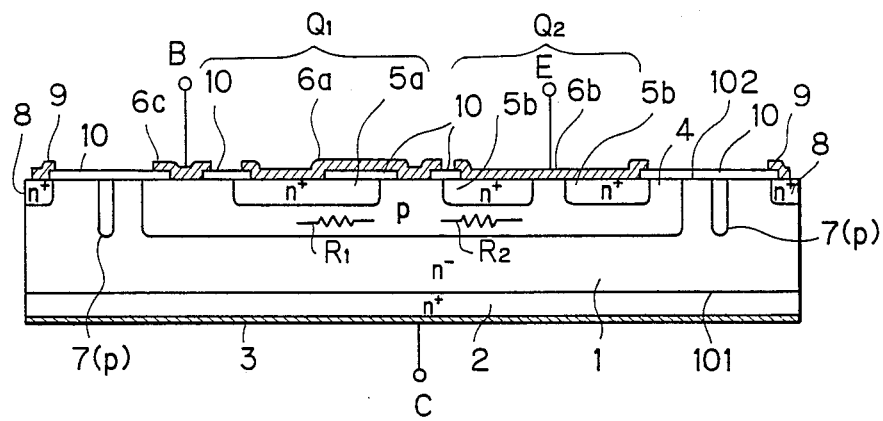
FIG. 1 is a sectional view showing a conventional power transistor.
Figure 2:
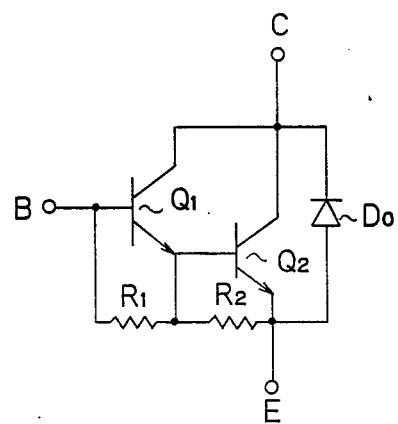
FIG. 2 is a circuit diagram showing an equivalent circuit of the transistor shown in FIG. 1.
Figure 3:
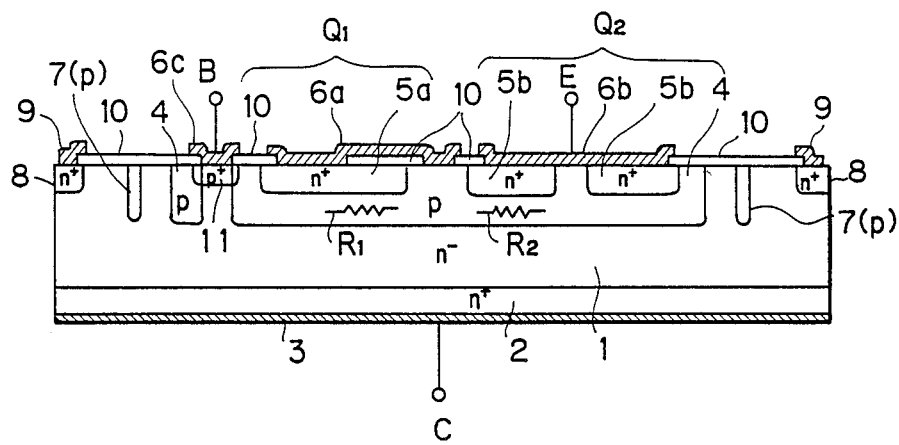
FIG. 3 is a sectional view showing a conventional transistor having a built-in clip diode.
Figure 4:
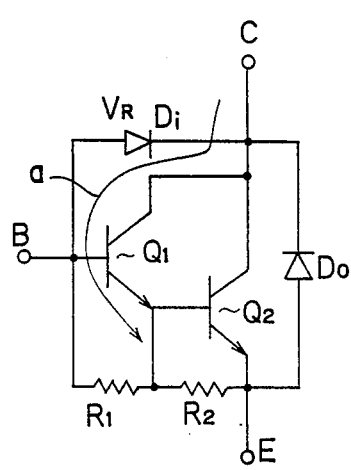
FIG. 4 is a circuit diagram showing an equivalent circuit of a transistor having a clip diode.
Figure 5:
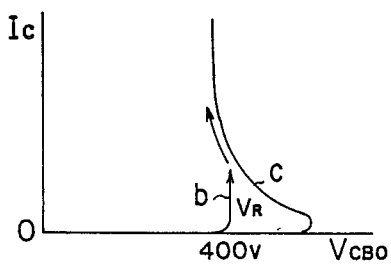
FIG. 5 illustrates clip voltage characteristic of the transistor in FIG. 3.
Figure 6:
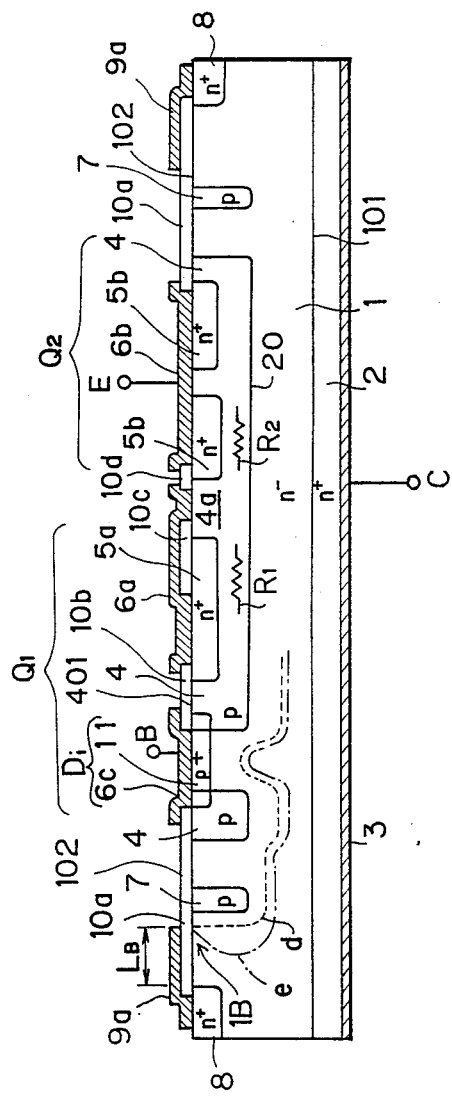
FIG. 6 is a sectional view showing the structure of a preferred embodiment of the present invention.

FIG. 6 is a sectional view showing structure of a transistor having a built-in clip diode according to an embodiment of the present invention. This embodiment is different of the conventional power transistor having a built-in clip diode shown in FIG. 3 in that a field plate 9a of aluminum formed on a channel cut region 8 is extended by prescribed size $L_B$ ($L_B = 100 \sim 200$ μm in this embodiment) on a silicon oxide film 10a from a position corresponding to inner edge of the channel cut region 8 toward a transistor-forming region. Other structure is identical to that of the conventional power transistor. The equivalent circuit thereof is similar to that shown in FIG. 4, except that a clip voltage in the device is controlled not only by intrinsic breakdown voltage of the diode $D_i$ but also by the extension of the field plate 9a.

An $n^+$-type diffusion layer 2 is formed on a first main surface 101 of an $n^-$-type substrate layer 1 of silicon, to form a collector common to two transistors $Q_1$ and $Q_2$. An aluminum wire layer 3 is formed on a surface of the $n^+$-type diffusion layer 2, and a collector terminal C is connected to the aluminum wire layer 3.

A p-type diffusion layer 4 is formed in a part of a second main surface 102 of the $n^-$-type substrate layer 1, to form bases of the two transistors $Q_1$ and $Q_2$. An $n^+$-type diffusion layers 5a and 5b are formed in a surface 401 of the p-type diffusion layer 4, to form emitters of the transistors $Q_1$ and $Q_2$ respectively.

A $p^+$-type diffusion region 11 is formed in a part of the surface 401 to form a p-type portion of a p-n junction diode $D_i$, and its lower surface faces the $n^-$-type substrate layer 1. As a result, the p-n junction diode $D_i$ consists of the $p^+$-diffusion region 11, the $n^-$-type substrate layer 1 and the $n^+$-type diffusion layer 2. This $p^+$-type diffusion region 11 contacts the $p^+$-type diffusion layer 4, and it has an island shape surrounded by the p-type diffusion layer 4.

A guard ring 7 of p-type silicon is formed in the second main surface 102 at the area surrounding the p-type diffusion layer 4. Further, a channel cut region 8 of $n^+$-type silicon having a ring shape is formed in the second main surface 102 at the peripheral portion of the semiconductor chip comprising the layers 1, 2, 4, 5a, 5b, 7 and 8. A silicon oxide film 10a is formed as an insulator over the second main surface 102 and a surface of the guard ring 7 between the p-type diffusion layer 4 and the channel cut region 8. The field plate electrode 9a covers a part of the silicon oxide film 10a, whereby the part of the silicon oxide film 10a is sandwiched between the field plate electrode 9a and the $n^-$-type substrate layer 1.

A silicon oxide film 10b is formed on a part of the surface 401 of the p-type diffusion layer 4 between the $p^+$-type diffusion layer 11 and the $n^+$-type diffusion layer 5a. A silicon oxide film 10c is formed over a boundary between the $n^+$-type diffusion layer 5a and a p-type intermediate region 4a, which is corresponding to a part of the p-type diffusion layer 4 and existing between the transistors $Q_1$ and $Q_2$. Further, a silicon oxide film 10d is formed over a boundary between the p-type intermediate region 4a and the $n^+$-type diffusion layer 5b.

In the transistor $Q_1$, an aluminum wire layer 6a is provided on surfaces of the $n^+$-diffusion layer 5a, the silicon oxide film 10c and the p-type intermediate region 4a. Namely, an emitter 5a of the transistor $Q_1$ is connected to a base 4 (4a) of the transistor $Q_2$ through the aluminum wire layer 6a.

As for the transistor $Q_2$, an aluminum wire layer 6b is provided on surfaces of the $n^+$-type diffusion layer 5b and the p-type diffusion layer 4, to be connected to an emitter terminal E. Namely, an emitter 5b of the transistor $Q_2$ is connected to the emitter terminal E.

Further, an aluminum wire layer 6c is provided on a surface of the $p^+$-type diffusion layer 11, to be connected to a base terminal B.

In this transistor, surge voltage clipping operation is performed as follows:

When surge voltage applied between the collector C and the emitter E begins to increase, a collector-base junction 20 as well as the p-n junction diode $D_i$ are reverse-biased. When the collector-base junction 20 is thus reverse-biased, a depletion layer spreads mainly in the $n^-$-type substrate layer 1, so that almost all of the applied voltage is supported by this depletion layer. When the depletion layer further spreads to reach the guard ring 7 following increase of the surge voltage, an electric potential is induced to the guard ring 7 so that the depletion layer spreads from p-n junction thereof toward the $n^-$-type substrate layer 1, whereby part of the surge voltage is supported by the guard ring 7. The depletion layer further spreads following further increase of the surge voltage. When the ambient temperature is relatively low, the surge voltage is clipped at the reverse breakdown voltage $V_R$ of the p-n junction diode $D_i$.

On the other hand, when the ambient temperature is so increased that the reverse breakdown voltage $V_R$ of the p-n junction diode $D_i$ is increased according to its temperature dependency, the depletion layer further spreads as shown by a broken line d in FIG. 6. Then the depletion layer finally reaches an end portion of the field plate 9a as shown by a one-dot chain line e. Since a positive potential is applied to the field plate 9a against the emitter terminal E, the field plate 9a exerts influence on the surface region of the $n^-$-type substrate layer 1 which exists just under a silicon oxide film 10a to block spreading of the depletion layer. As a result, the depletion layer connot sufficiently spread even when the ambient temperature is further increased to increase the reverse breakdown voltage $V_R$ of the p-n junction diode $D_i$. Therefore, field strength is increased at an plate-edge portion 1B of the $n^-$-type substrate layer 1 located immediately under an end portion of the field plate 9a, and breakdown begins to occur at the plate-edge portion 1B before at the p-n junction diode $D_i$. Namely, if the ambient temperature is further increased, the surge voltage is clipped on basis of the function of the field plate 9a before the surge voltage reaches the reverse breakdown voltage $V_R$ of the p-n junction diode $D_i$.

Since temperature dependency of breakdown voltage based on the function of the field plate 9a is one third to one quarter of that of the p-n junction diode $D_i$, temperature dependency of clip voltage is reduced as a whole to about one half of that in the case of the p-n junction diode $D_i$ alone.

Although the above embodiment has been described with reference to a Darlington power transistor, the present invention is also applicable to other types of transistors having built-in clip diodes.

According to the present invention as hereinabove described, surge voltage is clipped not only by a p-n junction diode interposed between a collector and a base of a transistor element but also by a field plate extended from a channel cut region toward an internal region where transistor are formed. As a result, the surge voltage can be clipped on basis of the functions of the field plate at a relatively low level before reaching the reverse breakdown voltage of the clip diode when the ambient temperature is increased to increase the reverse breakdown voltage. Thus, a transistor having a built-in clip diode and low temperature dependency on clip voltage can be easily obtained without employing a punch-through type p-n junction diode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
  (a) a semiconductor chip having:
    (a-1) a collector layer of a first conductivity type,
    (a-2) a base layer of a second conductivity type formed in a part of a first surface of said collector layer,
    (a-3) an emitter layer of said first conductivity type formed in a part of a surface of said base layer, and (a-4) a semiconductor layer of said second conductivity type formed in another part of said first surface, said semiconductor layer contacting said base layer and having higher conductivity than said base layer, a junction of said semiconductor layer and said collector layer being a pn diode junction;

(b) a collector electrode layer formed on a second surface of said collector layer, (c) an emitter electrode layer formed on a surface of said emitter layer, (d) a base electrode layer formed on a surface of said semiconductor layer, (e) an insulating film formed on a part of said first surface surrounding said base layer, and (f) a field plate electrode layer formed on a part of a surface of said insulation film, wherein said field plate electrode layer is included in a vertical projection of said first surface of said collector layer so that a part of said insulation film is sandwiched between said field plate electrode layer and said collector layer.

2. A semiconductor device in accordance with claim 1, wherein
said collector layer further comprises;
(a-1 *a*) a first collector layer existing under said collector electrode layer, and
(a-1*b*) a second collector layer existing between said first collector layer and said base layer and between said first collector layer and said first surface, said second collector layer having lower conductivity than said first collector layer.

3. A semiconductor device in accordance with claim 2, wherein
a channel cut region of said first conductivity type is formed in a part of said first surface existing in peripheral portion of said second collector layer, said channel cut region having higher conductivity than said second collector layer, and
said field plate electrode is formed over surfaces of said channel cut region and said insulation film.

4. A semiconductor device in accordance with claim 3, wherein
a guard ring region of said second conductivity type is formed under said insulation film and in intermediate portion of said second collector layer existing between said base layer and said channel cut region.

5. A semiconductor device in accordance with claim 4, wherein
a sub-emitter layer is formed in a part of said surface of said base layer and separated from said emitter layer by said base layer, and
an internal electrode layer is formed on a surface of said sub-emitter layer and a part of said surface of said base layer, whereby
a Darlington circuit is composed of said collector layer, said base layer, said emitter layer, said sub-emitter layer, and said internal electrode layer.

* * * * *